(12) United States Patent
Riederer et al.

(10) Patent No.: US 6,278,273 B1
(45) Date of Patent: Aug. 21, 2001

(54) MR FLUOROSCOPY WITH REVERSE-CENTRIC VIEW ACQUISITION

(75) Inventors: Stephen J. Riederer, Rochester, MN (US); Josef P. Debbins, Waukesha, WI (US); Reed F. Busse, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 0 days.

(21) Appl. No.: 09/444,071

(22) Filed: Nov. 22, 1999

(51) Int. Cl.[7] ........................................... G01V 3/00
(52) U.S. Cl. ............................. 324/309; 324/306
(58) Field of Search ........................... 324/300, 306, 324/307, 309, 311, 312, 314

(56) References Cited

U.S. PATENT DOCUMENTS

| | | | |
|---|---|---|---|
| 4,830,012 | 5/1989 | Riederer | 128/653 |
| 5,650,723 * | 7/1997 | Meyer | 324/309 |
| 6,121,775 * | 9/2000 | Pearlman | 324/309 |

\* cited by examiner

Primary Examiner—Louis Arana
(74) Attorney, Agent, or Firm—Quarles & Brady, LLP

(57) ABSTRACT

An MRI system produces a series of real-time images by repeatedly acquiring image data and repeatedly reconstructing images from the acquired image data. The effective latency period between acquisition of the image data and display of the reconstructed images is minimized by acquiring image data in a reverse-centric view order in which low spatial frequencies are acquired last.

9 Claims, 8 Drawing Sheets

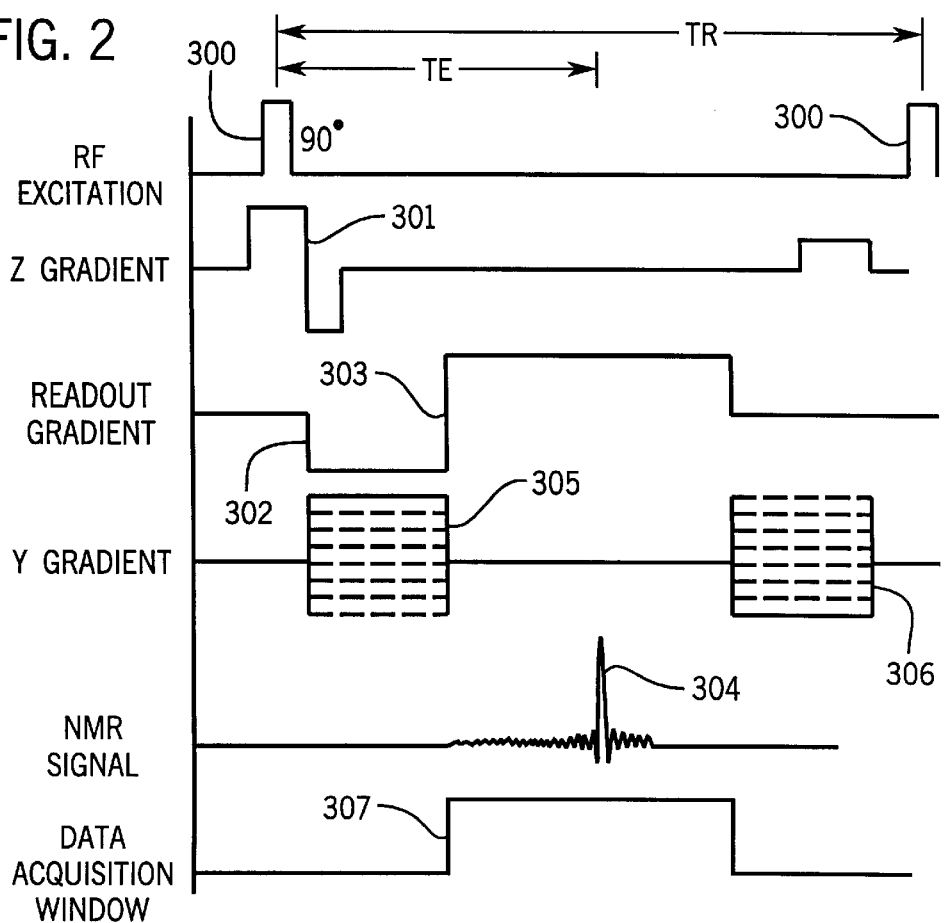
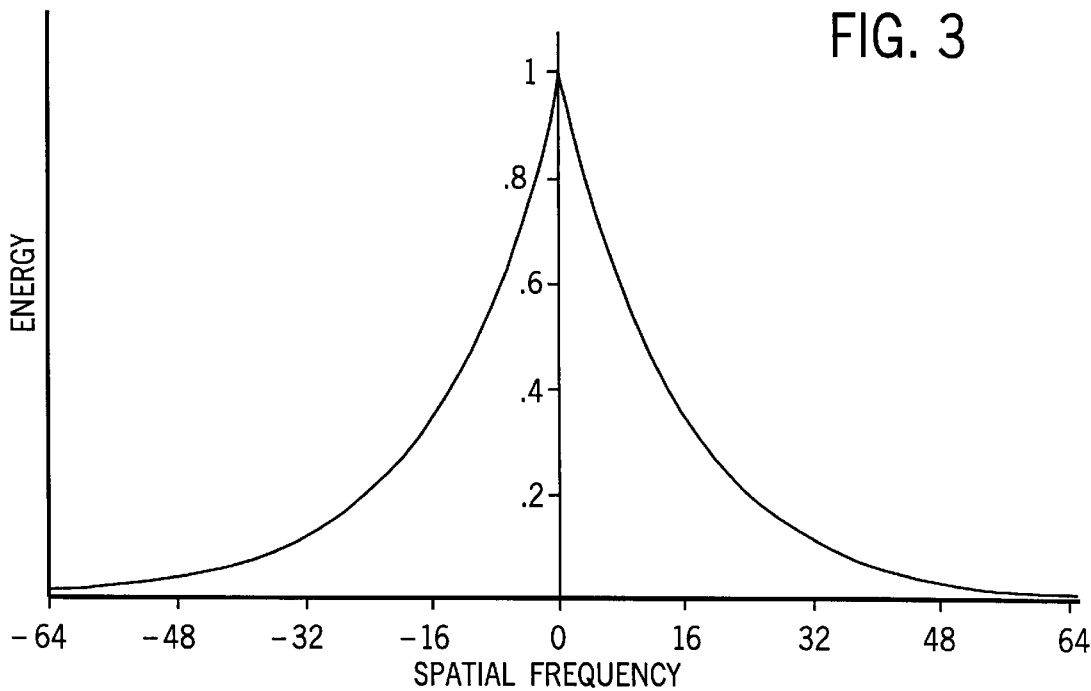

US 6,278,273 B1

MR FLUOROSCOPY WITH REVERSE-CENTRIC VIEW ACQUISITION

GOVERNMENT LICENSE RIGHTS

The U.S. Government has a paid-up license in this invention and the right in limited circumstances to require the patent owner to license others on reasonable terms as provided for by the terms of CA37993 and JL 37310 awarded by the National Institutes of Health.

BACKGROUND OF THE INVENTION

The field of the invention is nuclear magnetic resonance imaging (MRI) methods and systems. More particularly, the invention relates to real-time MRI, or MR fluoroscopy, in which data is acquired and images are reconstructed at relatively high update rates and low event-to-display latency.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. Each measurement acquires an NMR signal, or "view" with a particular set of gradient values that sample a part of frequency space, or "k-space". The measurements are repeated with different gradient values until k-space is sufficiently sampled. The resulting set of received NMR signals are processed to reconstruct an image using one of many well known reconstruction techniques.

The ability to provide MR images to an operator in real time is becoming critical to more an more applications such as contrast bolus triggering, interventional MR and cardiac imaging. Real-time MR imaging requires continuous, efficient data acquisition as well as rapid, on-line reconstruction and display.

MR "fluoroscopy" was first demonstrated in U.S. Pat. No. 4,830,012 using a fast two-dimensional Fourier transform (2DFT) gradient-echo sequence with sequential phase-encode sampling. Using a view-sharing reconstruction technique, a given view may be used in the formation of more than one image. Views are acquired continuously, and image frames are reconstructed using recently acquired views and views acquired prior to the last reconstruction. This view-sharing allows more frequent image updating than if waiting for an entire set of new views to be collected. Similar view-sharing reconstruction techniques have subsequently been implemented for radial, spiral, and echo planar imaging (EPI) acquisitions.

Because low spatial frequency views (i.e. center of k-space) provide gross positional and contrast information while high-frequency views provide edge and detail information, temporal resolution is determined not only by the frequency of reconstruction, but also by the frequency at which the central region of k-space is sampled. Considering this, it was proposed that temporal resolution could be increased by sampling the central region of k-space more frequently than the remainder. Several investigators have implemented such differential-rate strategies for 2D imaging, either with or without real-time image reconstruction. Such methods reduce the time needed to acquire a frame of image data.

While high temporal resolution techniques have been pursued with great interest, the overall quality of true real-time imaging depends on more than just the frequency of data acquisition and reconstruction, defined as the "frame rate". More particularly, the display latency, or period of time between the occurrence of an event in the subject and the depiction of the event on a display should be as short as possible. This is not determined exclusively by the speed of acquisition and reconstruction hardware.

SUMMARY OF THE INVENTION

The present invention is a method for acquiring MR images such that the latency between the occurrence of events in the subject being imaged and the display of such events in a reconstructed image is minimized. More particularly, imaging pulse sequences are performed during an acquisition period and the imaging gradients are changed in those pulse sequences such that k-space is sampled beginning at the periphery of k-space and progressively sampling closer to the center of k-space. This "reverse-centric" view ordering enables the low frequency views to be acquired just before image reconstruction begins and it thus substantially reduces the apparent latency.

An important scientific principle is the manner in which image energy is distributed among the sampled spatial frequencies. For most images, and in particular medical images, the image energy is highest at the lowest spatial frequencies (i.e. center of k-space). By acquiring these higher image energy views at the last moment before image reconstruction begins, it has been discovered that the apparent latency in the displayed image is substantially reduced.

BRIEF DESCRIPTION OF THE DRAWINGS

FIG. 2 is a graphic illustration of a gradient-recalled pulse sequence used to acquire image data on the MRI system of FIG. 1 according to the preferred embodiment of the invention;

FIG. 3 is a graphic representation of the image energy contained in NMR signals acquired at different k-space spatial frequencies;

DESCRIPTION OF THE PREFERRED EMBODIMENT

Figure 1:
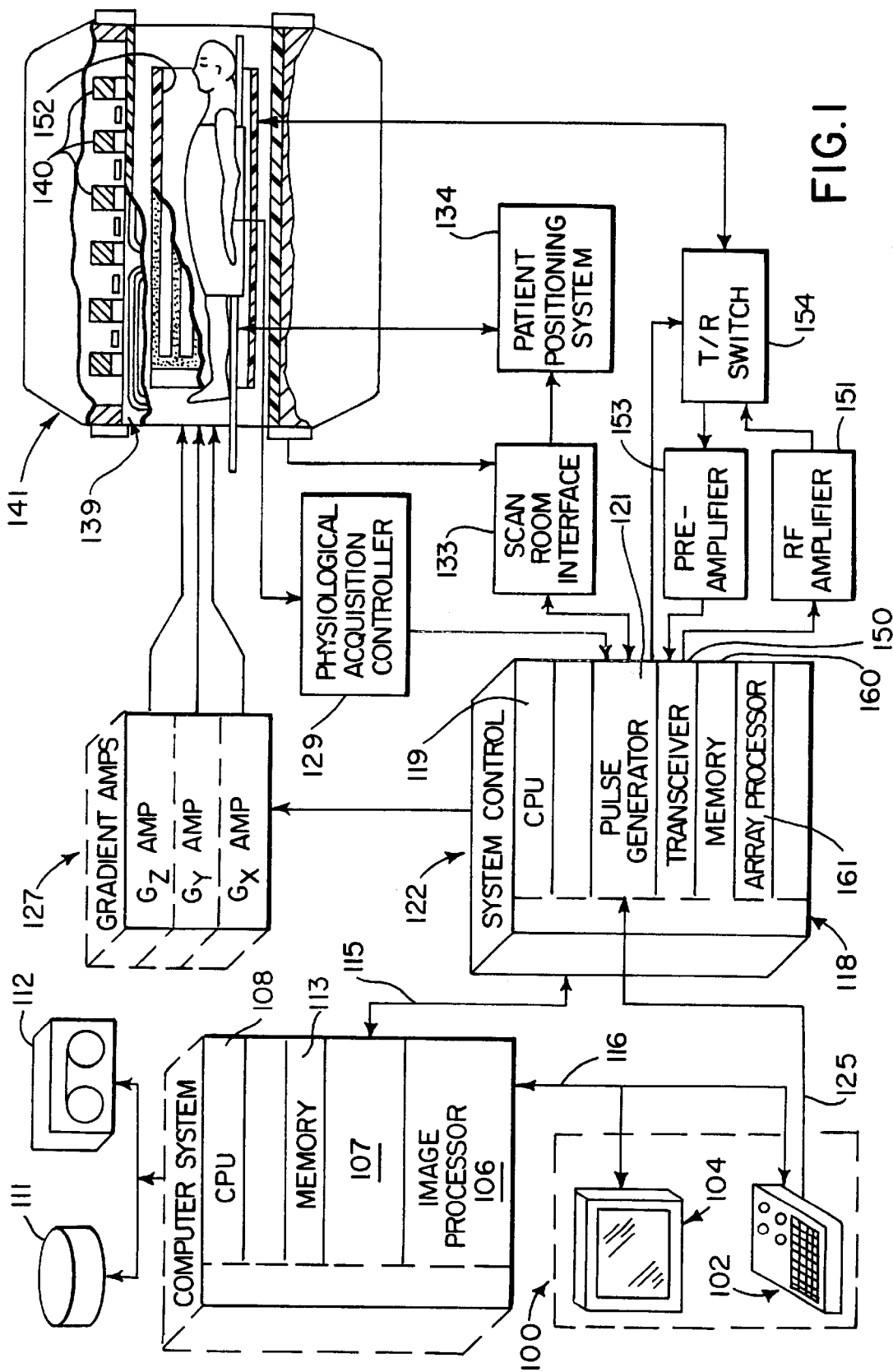
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is presented on the display 104. A similar display 104 may be located near the physician to provide real-time images that are used to guide a medical procedure being performed on the patient.

The NMR system of FIG. 1 performs a series of pulse sequences to collect sufficient NMR data to reconstruct an image. The pulse sequence employed in the preferred embodiment is a two-dimensional fast gradient-recalled echo pulse sequence which is well known in the art. This pulse sequence is shown in FIG. 2 and includes a selective RF excitation pulse 300 which is produced in the presence of a slice select gradient pulse 301. A negative readout gradient pulse 302 is then applied to dephase the excited spins and this is followed by a positive readout gradient pulse 303 which refocuses the spins and produces a gradient recalled NMR echo signal 304 which peaks at a time TE following the excitation pulse 300. The readout gradient pulse 303 also frequency encodes the signal 304 to provide x-axis position encoding. In addition, y-axis position encoding is provided by a phase encoding pulse 305 applied before the acquisition of echo signal 304, and a corresponding rewinder pulse 306 applied after the acquisition of echo signal 304. The phase encoding pulses 305 and 306 are stepped through a set of values (e.g. 128 values) during the acquisition of a single image in accordance with a stored view order schedule read by the pulse generator 121.

The present invention employs an imaging pulse sequence such as that shown in FIG. 2 to acquire a sequence of image frames in rapid succession, and to reconstruct and display the corresponding images on display 104 as quickly as possible. The rate at which such images can be displayed ("frame rate") is determined by a number of factors in addition to the inherent speed of the hardware. These include the TR of the imaging pulse sequence, and the number of phase-encoding views to be obtained for each image frame. The total number of phase-encoding views is set by the prescribed image resolution in the phase-encoding direction. However, methods can be used to acquire less than all the views during the acquisition period for each image frame. For example, as described in the above-cited U.S. Pat. No. 4,830,012, fewer than all the views may be acquired during the acquisition periods between image reconstructions and previously acquired views are reused to reconstruct each frame. Such "shared" views are usually those which sample the periphery of k-space.

Whatever methods may be used to arrive at the image frame rate, the present invention is employed to reduce the latency between an event occurring in the patient being imaged and the depiction of that event on the display 104. In the following discussion, the terms "view", "spatial frequency" and location of k-space sampling are used interchangeably and refer to the NMR signals acquired with particular phase-encoding values.

The number of spatial frequency measurements needed to reconstruct an image is given as N, where N is typically in the range of 128 to 256. For most images, and in particular medical images, the image energy is highest at the lowest spatial frequencies, and drops off rapidly as spatial frequencies increase. Since images are mostly "real" (as opposed to "imaginary" in complex number terminology) the energy distribution is symmetric for spatial frequencies of positive and negative polarities. FIG. 3 shows the energy distribution for a typical medical image.

Figure 4:
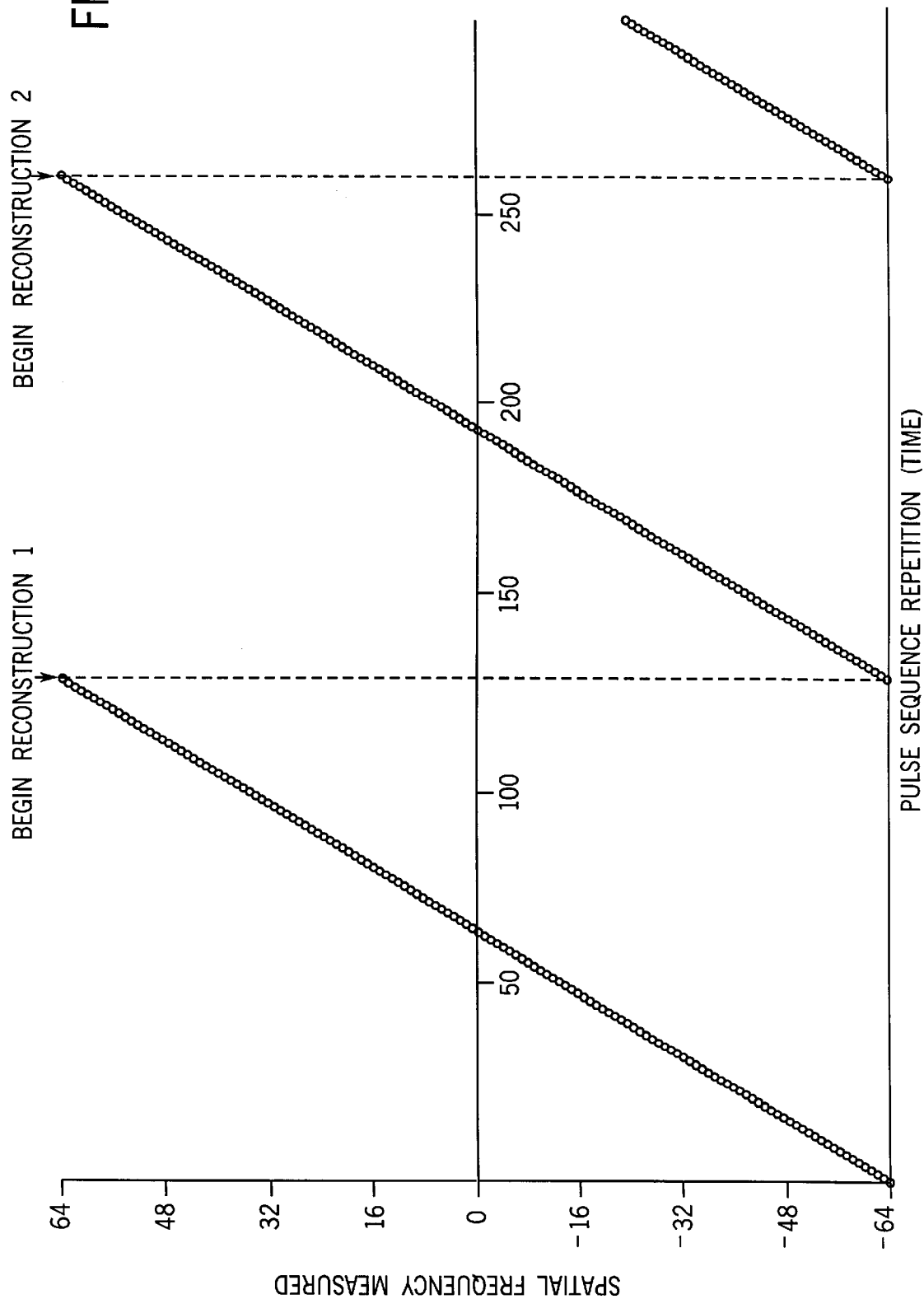
FIG. 4 is a graphic representation of a conventional, sequential view order acquisition schedule used to acquire a series of real-time images.

As shown in FIG. 4, in a standard procedure, the entire N views are collected in a sequential order such that the highest spatial frequency measurements of one polarity are made first, then progressively lower spatial frequency measurements are collected, proceeding through the "zero" or "D.C." frequency, and finally continuing to the highest spatial frequencies of the opposite polarity. After all N measurements are collected, the image reconstruction procedure begins, and the process is repeated indefinitely in order to monitor the change or movement which occurs in the patient from image to image.

Figure 5:
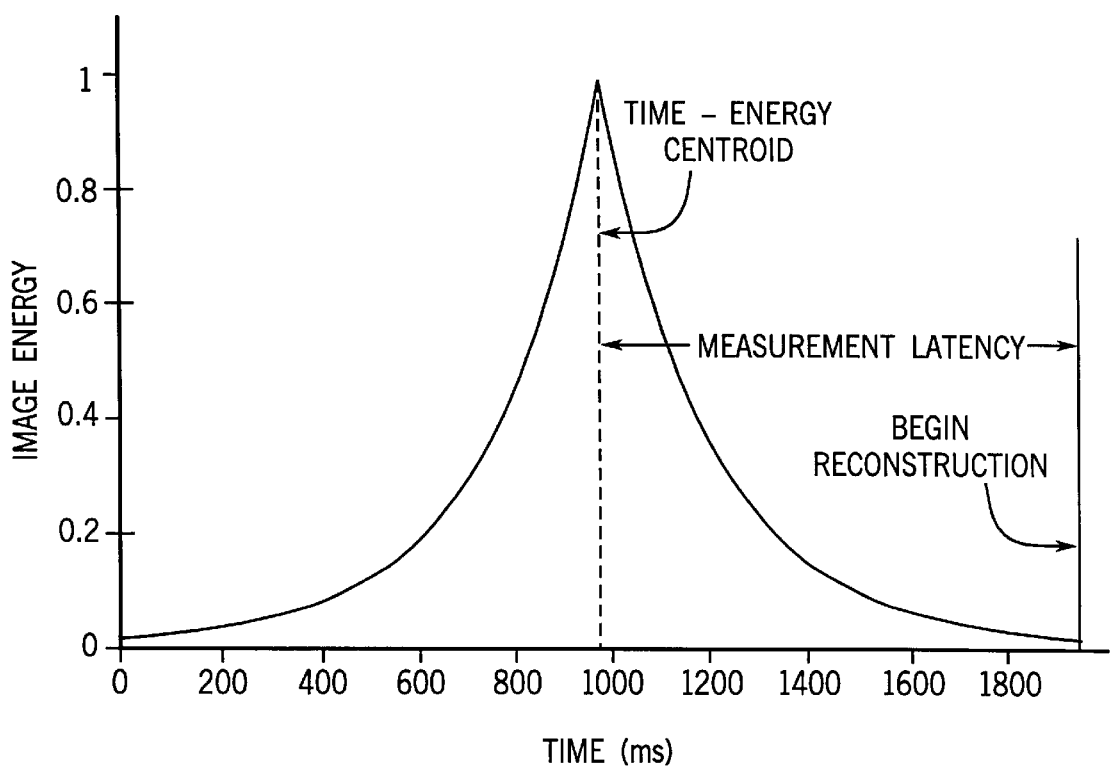
FIG. 5 is a graphic illustration of the time versus image energy acquired using the sequential view order schedule of FIG. 4.

Latency may be estimated by calculating the energy-weighted mean measurement time, as shown in FIG. 5. The amount of latency introduced by this measurement scheme is $N/2 \times TR$, where TR is the measurement repetition time, typically on the order of 10 msec. For example, if N=192 and TR=12 msec, then the latency time would be $192/2 \times 14$ msec=1.3 seconds.

Figure 6:
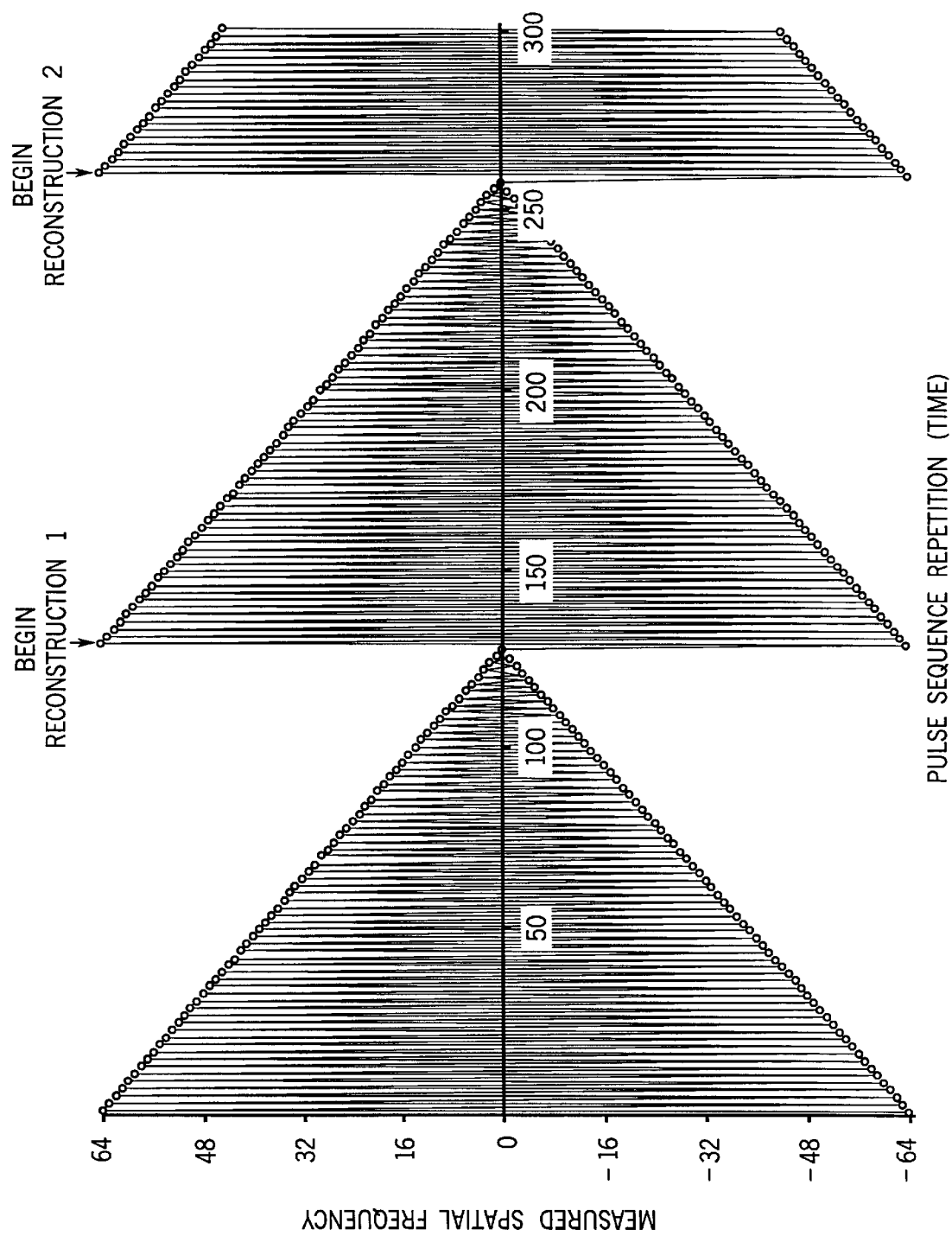
FIG. 6 is a graphic representation of a reverse-centric view order acquisition schedule used according to the present invention to acquire a series of real-time images.

The present invention is practiced by reordering the views in the stored view order schedule such that high spatial frequencies of both polarities are acquired during the acquisition period before the lower spatial frequencies are acquired as shown in FIG. 6. This view order configuration we term "reverse-centric".

Figure 7:
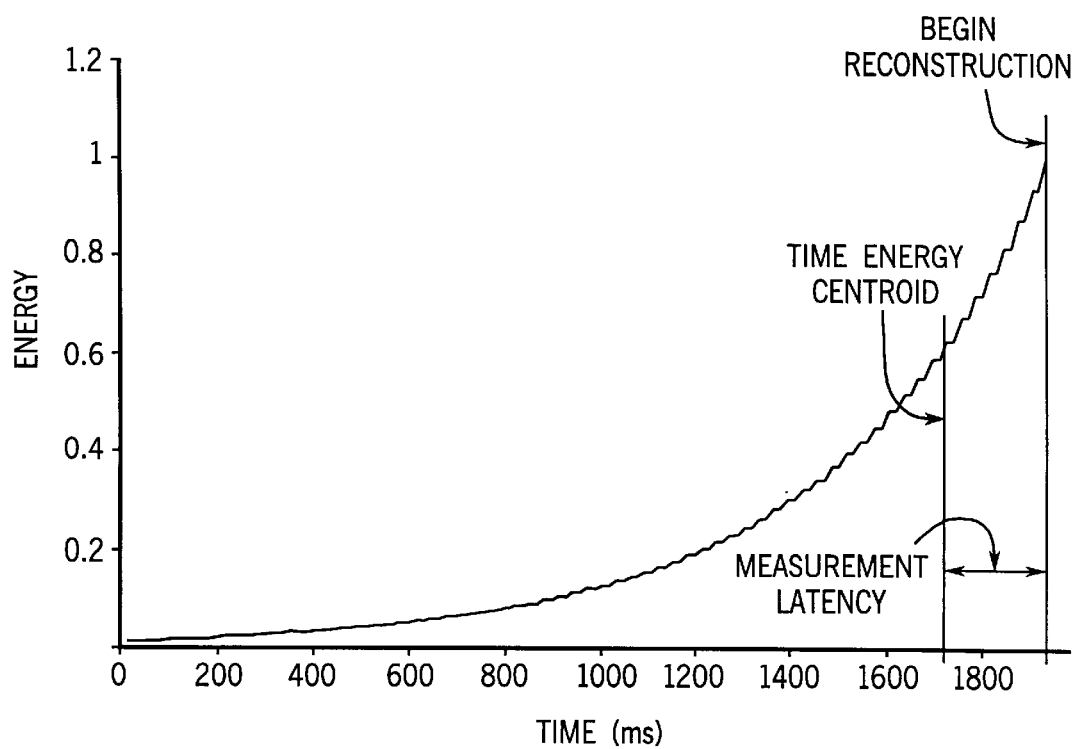
FIG. 7 is a graphic illustration of the time versus image energy using the reverse-centric view order of schedule of FIG. 6.

The amount of latency introduced by this measurement scheme depends on the spatial frequency distribution of the particular image, but assuming a monotonic decrease in energy away from the center of k-space, the latency will always be minimized by the reverse-centric scheme. FIG. 7 shows how the image energy-weighted mean measurement time is much closer to the time at which reconstruction of the data begins when the reverse-centric view order is used. This results in lower latency than a conventional sequential view order. Experiments have demonstrated that the latency is reduced to $\frac{1}{3}$–$\frac{1}{8}$ of the latency that occurs when sequential view ordering is employed.

Figure 8:
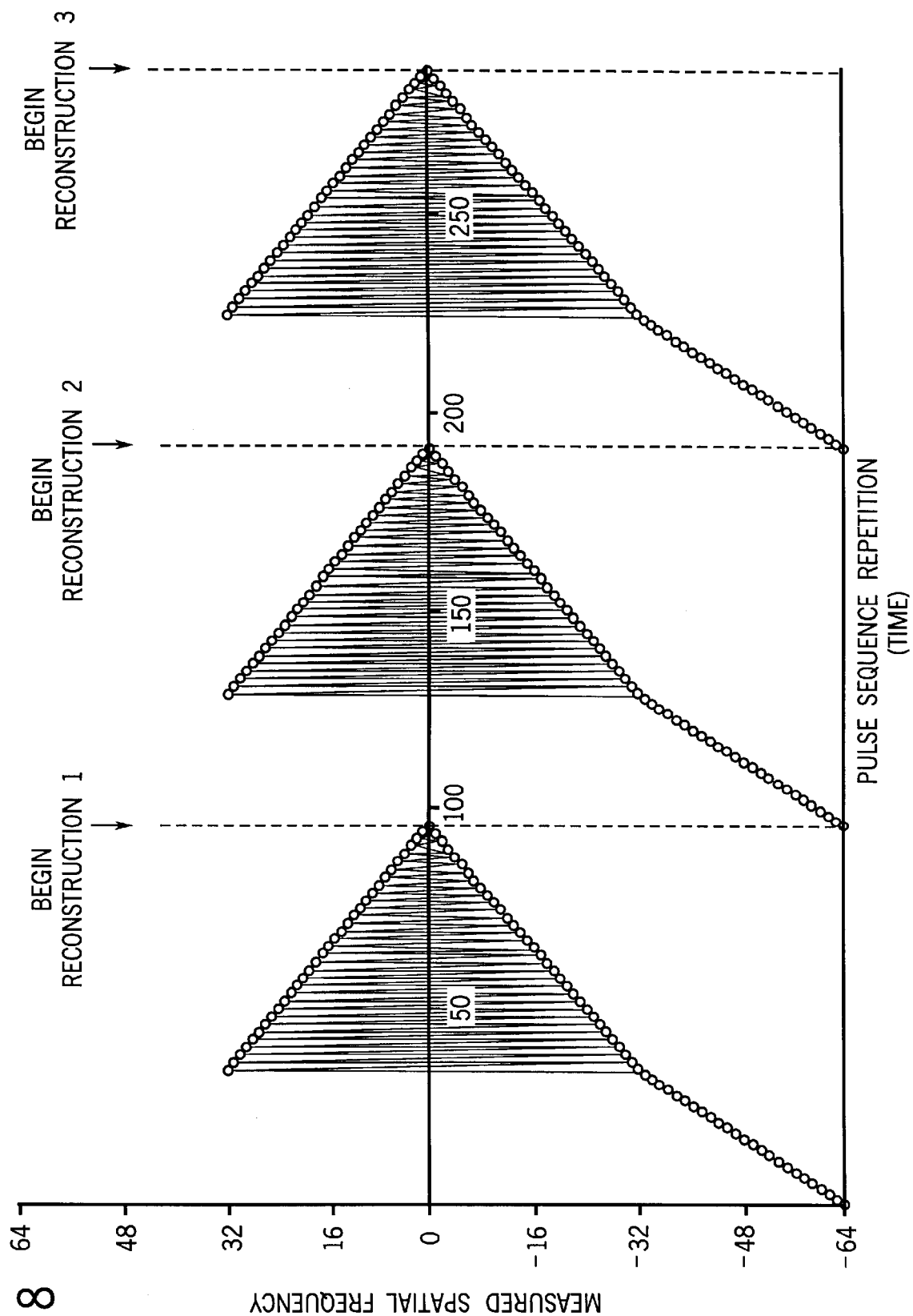
FIG. 8 is a graphic representation of an alternative embodiment of the reverse-centric view order schedule when a partial-NEX acquisition is used.

The present invention may also be used when partial-NEX or partial view updating methods are employed. Partial-NEX imaging exploits the symmetry of k-space to form an image with only a subset of the entire N measurements, typically $\frac{3}{4}$ or $\frac{5}{8}$ N. For example, only the views from −64 to +32 are acquired during the acquisition period and the missing views from +33 to +64 are filled with data during the reconstruction process. The standard "sequential" view order is normally used to acquire each image frame, starting at view −64 and ending with view +32. Using the reverse-centric view order of the present invention, the views in the stored view order schedule are ordered from the highest spatial frequency (of either polarity) to the lowest as illustrated in FIG. 8.

When partial-NEX acquisitions are employed the missing image data is filled in during the image reconstruction process. A number of methods are known in the art for performing this function, including for example, the Homodyne reconstruction method described by D. C. Noll, D. G. Nishimura, A. Macovski: "Homodyne Detection In Magnetic Resonance Imaging," IEEE Trans. Med. Imag. 10(2): 154–163, 1991.

Figure 9:
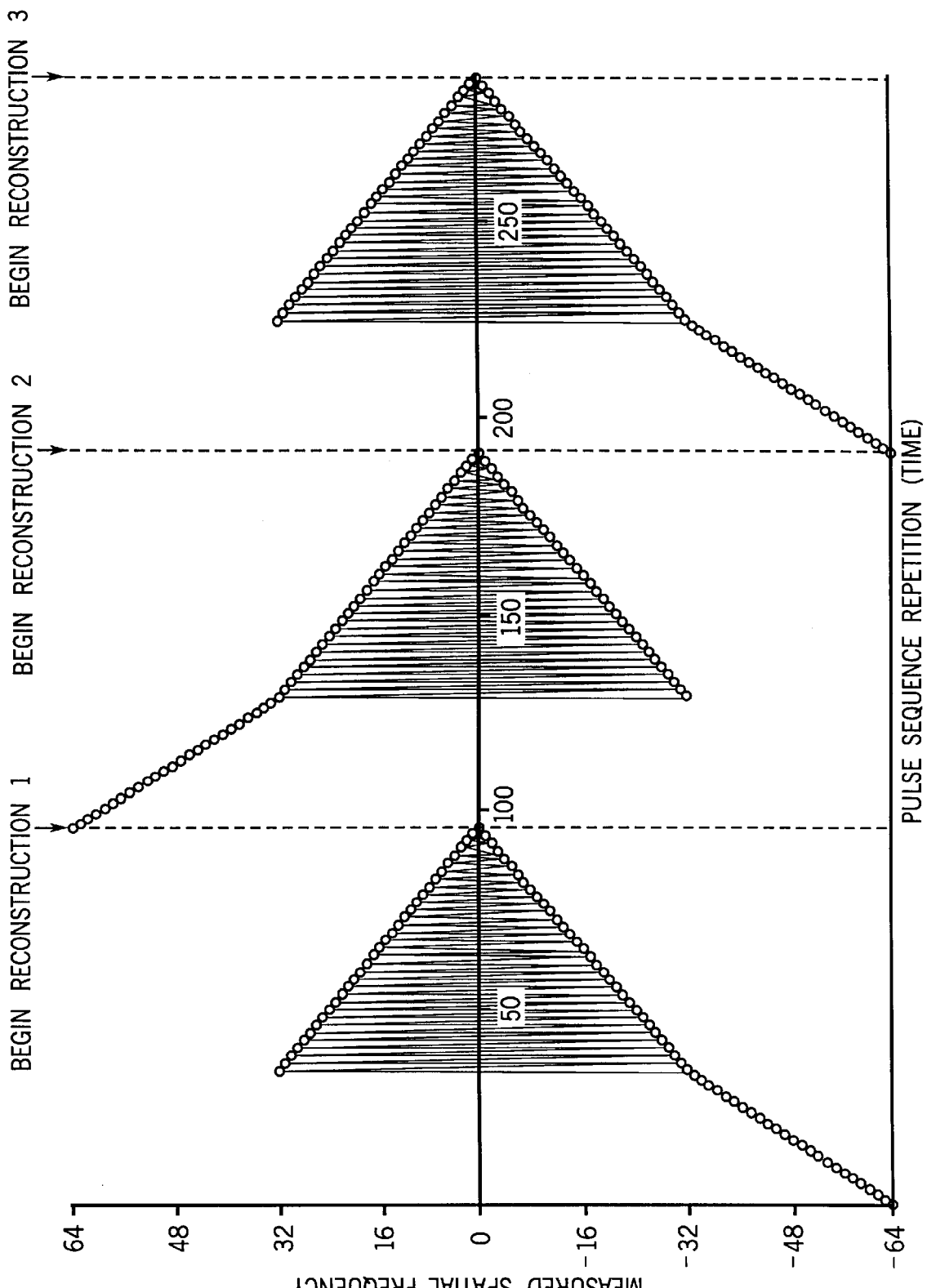
FIG. 9 is a graphic representation of an alternative embodiment of the reverse-centric view order schedule when a partial update of the image data set is performed during each acquisition period.

An alternative or in addition to acquiring only a portion of k-space, one may only update a portion of k-space during the acquisition period for each image frame. For example, k-space may be divided into regions and these regions are acquired during the scan according to a stored view order schedule. In some methods, the central region of k-space, is acquired more frequently than the peripheral regions are acquired. Regardless of the update schedule that is used, to practice the present invention the views are acquired in an order starting from the highest spatial frequency and progressively sampling toward the lowest spatial frequency in a given reconstruction interval. An example of one such acquisition order is illustrated in FIG. 9. Total k-space is acquired, but only a central region of k-space extending from −32 to +32 is acquired during each acquisition interval. Two peripheral k-space regions extending from −64 to −32 and +64 to +32 are acquired during alternate acquisition periods. The views are ordered to acquire one of the peripheral k-space regions starting at the highest spacial frequency (i.e. −64 or +64) and progressively sampling to the lowest spatial frequency (−32 or +32), and then acquiring the central region of k-space starting at the highest spatial frequency (i.e. ±32) and progressively sampling to the center of k-space.

Many k-space sampling schedules are possible and it is a teaching of the present invention that regardless of the schedule employed, the views with the lowest spatial frequency and highest image energy are to be acquired last. This ensures that a minimal latency will be achieved for any given hardware and software configuration. However, minor variations from this optimal view order are possible without significantly affecting the latency period. For example, when acquiring high frequency spatial samples from regions at the periphery of k-space, the sample order can be altered without significantly changing the time-energy centroid of the acquired image data.

What is claimed is:

1. A method for producing a series of images with an MRI system, the steps comprising:

a) acquiring image data during an acquisition period by performing a series of imaging pulse sequences in which NMR signals are produced that sample k-space in an order beginning at a highest spatial frequency and progressively sampling to a lowest spatial frequency;

b) promptly reconstructing an image using the image data acquired in step a);

c) promptly displaying the image reconstructed in step b); and d) repeating the steps a), b) and c) during a succession of acquisition periods to produce the series of images.

2. The method as recited in claim 1 in which different k-space sampling orders are employed during the succession of acquisition periods.

3. The method as recited in claim 2 in which all of the different k-space sampling orders include performing a series of imaging pulse sequences that sample a central region of k-space at the end of each acquisition period.

4. The method as recited in claim 1 in which substantially the same k-space sampling order is used in each of the succession of acquisition periods.

5. The method as recited in claim 4 in which the k-space sampling order does not sample all high frequency spatial frequencies and step b) includes filling in the missing image data as part of the image reconstruction process.

6. A method for producing a series of images of a subject with an MRI system, the steps comprising:

a) acquiring image data in a succession of acquisition periods, each image data acquisition period including:
   i) performing an image pulse sequence with the MRI system to acquire an NMR signal that samples selected spatial frequencies of k-space;
   ii) digitizing the acquired NMR signal to produce image data;
   iii) altering an image gradient in the image pulse sequence in accordance with a view order schedule;
   iv) repeating steps i), ii) and iii) until an image data set is produced;
b) reconstructing an image from each image data set produced during each of the succession of acquisition periods; and
c) displaying each reconstructed image on a display device as soon as it is reconstructed; and
where the view order schedule acquires low frequency k-space samples at the end of each acquisition period such that the latency between events occurring in the subject and the depiction of such events on the display device is minimized.

7. The method as recited in claim 6 in which the view order schedule samples k-space during each acquisition period commencing with the highest frequency k-space samples first and progressively sampling k-space frequencies until the lowest k-space frequency to be sampled is sampled last.

8. The method as recited in claim 6 in which less than all of the spatial frequencies in k-space are acquired during the acquisition, and step b) includes filling in the missing k-space spatial frequency samples with data during the image reconstruction process.

9. The method as recited in claim 6 in which less than all of the spatial frequencies in k-space are acquired during each acquisition period, and k-space spatial frequency samples acquired during a previous acquisition period are employed to produce the image data set employed in step b).

* * * * *